(12) United States Patent
Araki (10) Patent No.: US 8,296,629 B2
(45) Date of Patent: Oct. 23, 2012

(54) RDS COMPATIBLE RECEIVER AND RDS DATA RECEIVING METHOD

(75) Inventor: Yoshitsugu Araki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 811 days.

(21) Appl. No.: 12/255,374

(22) Filed: Oct. 21, 2008

(65) Prior Publication Data

US 2009/0106629 A1 Apr. 23, 2009

(30) Foreign Application Priority Data

Oct. 22, 2007 (JP) ................................. 2007-273620

(51) Int. Cl.
*G06F 11/00* (2006.01)
(52) U.S. Cl. ......................... 714/775; 714/707; 714/798
(58) Field of Classification Search .................. None
See application file for complete search history.

(56) References Cited

U.S. PATENT DOCUMENTS

| | | | | |
|---|---|---|---|---|
| 4,821,270 | A * | 4/1989 | Mauge ........................... | 714/798 |
| 5,745,503 | A * | 4/1998 | Kuusinen ....................... | 714/752 |
| 5,809,094 | A * | 9/1998 | Masumoto et al. ............ | 375/365 |
| 6,195,783 | B1 * | 2/2001 | Nyenhuis et al. .............. | 714/798 |
| 2007/0245143 | A1 * | 10/2007 | Duckeck ........................ | 713/168 |
| 2009/0103651 | A1 * | 4/2009 | Lahtonen et al. ............. | 375/308 |
| 2010/0091916 | A1 * | 4/2010 | Henriksson et al. .......... | 375/343 |

FOREIGN PATENT DOCUMENTS

| | | | |
|---|---|---|---|
| EP | 491084 | A1 * | 6/1992 |
| JP | 08-256135 | | 10/1996 |
| JP | 09270777 | A * | 10/1997 |
| JP | 11-509389 | | 8/1998 |
| JP | 11-502381 | | 2/1999 |
| JP | 11-509389 | | 8/1999 |
| JP | 2001-177421 | | 6/2001 |
| JP | 2003018141 | A * | 1/2003 |
| WO | 96/31032 | | 10/1996 |
| WO | 97/04550 | | 2/1997 |

OTHER PUBLICATIONS

Japanese Office Action for Japanese Patent Application No. 2007-273620 mailed on Nov. 25, 2011.

* cited by examiner

*Primary Examiner* — Gabriel Chu
(74) *Attorney, Agent, or Firm* — Turocy & Watson, LLP (57) ABSTRACT

An RDS compatible receiver has a demodulator which demodulates RDS data, a register which converts the demodulated RDS data to block data and outputs the block data, an offset generating unit which predicts and outputs an offset word of the block data based on values of a pattern match flag signal and a synchronization flag signal, an error correction processing unit which performs error correction of the block data using the predicted offset word, compares the number of error corrections with a predetermined correction threshold, determines whether the predicted offset word is right or not based on the comparison result, and outputs the pattern match flag signal based on the determination result, and a synchronization determining unit which detects whether or not the predicted offset word determined to be right matches a predetermined offset sequence pattern, determines whether RDS block synchronization is established or not, and outputs the synchronization flag signal based on the determination result.

10 Claims, 7 Drawing Sheets

RDS COMPATIBLE RECEIVER AND RDS DATA RECEIVING METHOD

CROSS REFERENCE TO RELATED APPLICATION

This application is based upon and claims benefit of priority from the Japanese Patent Application No. 2007-273620, filed on Oct. 22, 2007, the entire contents of which are incorporated herein by reference.

BACKGROUND OF THE INVENTION

The present invention relates to an RDS compatible receiver and an RDS data receiving method.

An RDS (Radio Data System) has been put into practical use, which allows a program name and a program type to be automatically received, and allows automatic search for an alternative station broadcasting the same program when a reception condition is poor, by adding additional data other than broadcast waves in FM broadcast programs.

RDS data is repeatedly broadcasted on a group basis in which each group is 104-bit data. Each group consists of four blocks, and each block is composed of a 16-bit information word and a 10-bit appended word. An appended word is generated by an exclusive OR operation between a check word derived by syndrome calculation of error correcting code from an information word and an offset word for block identification.

The check word is added to protect data from an error of received data caused by an effect of multipath noise or the like during reception of broadcast waves, and is based on shortened cyclic code.

Offset words added to four blocks in an RDS data group are "A", "B", "C" (or "C'"), "D" in order, and a sequential number of block data can be determined from an offset word.

A synchronization detecting circuit of an RDS receiver captures 26-bit data at first, and shifts it bit by bit until offset word matching is detected by syndrome calculation. If offset word matching is detected, next 26 bits are captured and offset word matching detection is performed thereon. Then, at a time when this block and its previous block are confirmed to match an offset sequence pattern, they are determined to be in a block synchronous state.

However, in such a synchronization determining method, if offset word matching detection in a first block is false positive due to an effect of a poor reception condition caused by multipath interference or the like, the blocks are found to be not synchronized when further 26 bits are captured and offset word matching detection is performed thereon. In this case, bit-by-bit shifting is again performed until offset word matching is detected. Thus, there is a problem that a long time is required until synchronization determination is completed.

To solve this problem, an RDS receiver has been proposed which performs determination of matching is performed each time one bit data is captured even after a first offset word matching detection is performed by syndrome calculation (For example, see Japanese Patent Laid-Open No. 8-256135). Therefore, even if a first offset word matching detection is false positive, a quick return to normal data capturing is allowed, and synchronization determination can be quickly performed.

However, an RDS receiver as described above needs syndrome calculation processing when offset word matching detection is performed, and its processing load is heavy. In addition, when a reception state is poor such as in a weak electric field, received data often contains an error, and synchronization establishment (detection) takes a long time.

SUMMARY OF THE INVENTION

According to one aspect of the present invention, there is provided an RDS compatible receiver comprising:

a demodulator which demodulates RDS data included in a received broadcast wave and outputs demodulated RDS data;

a register which converts the demodulated RDS data to block data and outputs the block data;

an offset generating unit which is given a pattern match flag signal and a synchronization flag signal, predicts an offset word of the block data based on values of the pattern match flag signal and the synchronization flag signal, and outputs the predicted offset word;

an error correction processing unit which is given the predicted offset word and the block data, performs error detection and error correction of the block data using the predicted offset word, counts the number of error corrections, compares the number of error corrections with a predetermined correction threshold, determines whether the predicted offset word is right or not based on the comparison result, and outputs the pattern match flag signal based on the determination result; and a synchronization determining unit which is given the predicted offset word and the pattern match flag signal sequentially, detects whether or not the predicted offset word determined to be right matches a predetermined offset sequence pattern, determines whether RDS block synchronization is established or not based on the detection result, and outputs the synchronization flag signal based on the determination result.

According to one aspect of the present invention, there is provided an RDS compatible receiver comprising:

a demodulator which demodulates RDS data included in a received broadcast wave and outputs demodulated RDS data;

a register which converts the demodulated RDS data to block data and outputs the block data;

an offset generating unit which is given a pattern match flag signal and a synchronization flag signal, predicts an offset word of the block data based on values of the pattern match flag signal and the synchronization flag signal, and outputs the predicted offset word;

a first multiplexer which is given a check flag signal, error correction block data, the block data, selects and outputs the block data if the check flag signal is a first value, and selects and outputs the error correction block data if the check flag signal is a second value which is different from the first value;

an error correction processing unit which is given the predicted offset word, output data of the first multiplexer, and the check flag signal, and if the check flag signal is the first value, performs error detection and error correction of the block data using the predicted offset word, counts the number of error corrections, compares the number of error corrections with a predetermined correction threshold, determines whether the predicted offset word is right or not based on the comparison result, and outputs the pattern match flag signal based on the determination result, and if the check flag signal is the second value, performs error detection of the error correction block data using the predicted offset word, determines whether the predicted offset word is right or not based on the detection result, and outputs the pattern match flag signal based on the determination result;

a corrected data register which stores the block data whose error is corrected by the error correction processing unit and outputs the block data as the error correction block data; and a synchronization determining unit which is given the predicted offset word and the pattern match flag signal sequentially, detects whether or not the predicted offset word determined to be right matches a predetermined offset sequence pattern, determines whether RDS block synchronization is established or not based on the detection result, and outputs the synchronization flag signal based on the determination result.

According to one aspect of the present invention, there is provided an RDS data receiving method comprising:

demodulating RDS data included in a received broadcast wave to generate demodulated RDS data;

converting the demodulated RDS data to block data, and generating first block data and second block data in sequence;

predicting an offset word corresponding to the first block data to generate a first predicted offset word, performing error detection and error correction of the first block data using the first predicted offset word, and counting the number of error corrections to calculate a first number of error corrections;

comparing the first number of error corrections with a predetermined correction threshold, and determining the first predicted offset word is right if the first number of error corrections is less than or equal to the correction threshold;

predicting an offset word corresponding to the second block data to generate a second predicted offset word;

performing error detection and error correction of the second block data using the second predicted offset word, and counting the number of error corrections to calculate a second number of error corrections;

comparing the second number of error corrections with the correction threshold, and determining the second predicted offset word is right if the second number of error corrections is less than or equal to the correction threshold; and if both of the first predicted offset word and the second predicted offset word are determined to be right, detecting whether or not an order of the first predicted offset word and the second predicted offset word matches a predetermined offset sequence pattern, and if it matches, determining RDS block synchronization to be established and outputting the second block data whose error is corrected.

DESCRIPTION OF THE EMBODIMENTS

Hereinafter, embodiments of the present invention will be described with reference to the drawings.

First Embodiment

Figure 1:
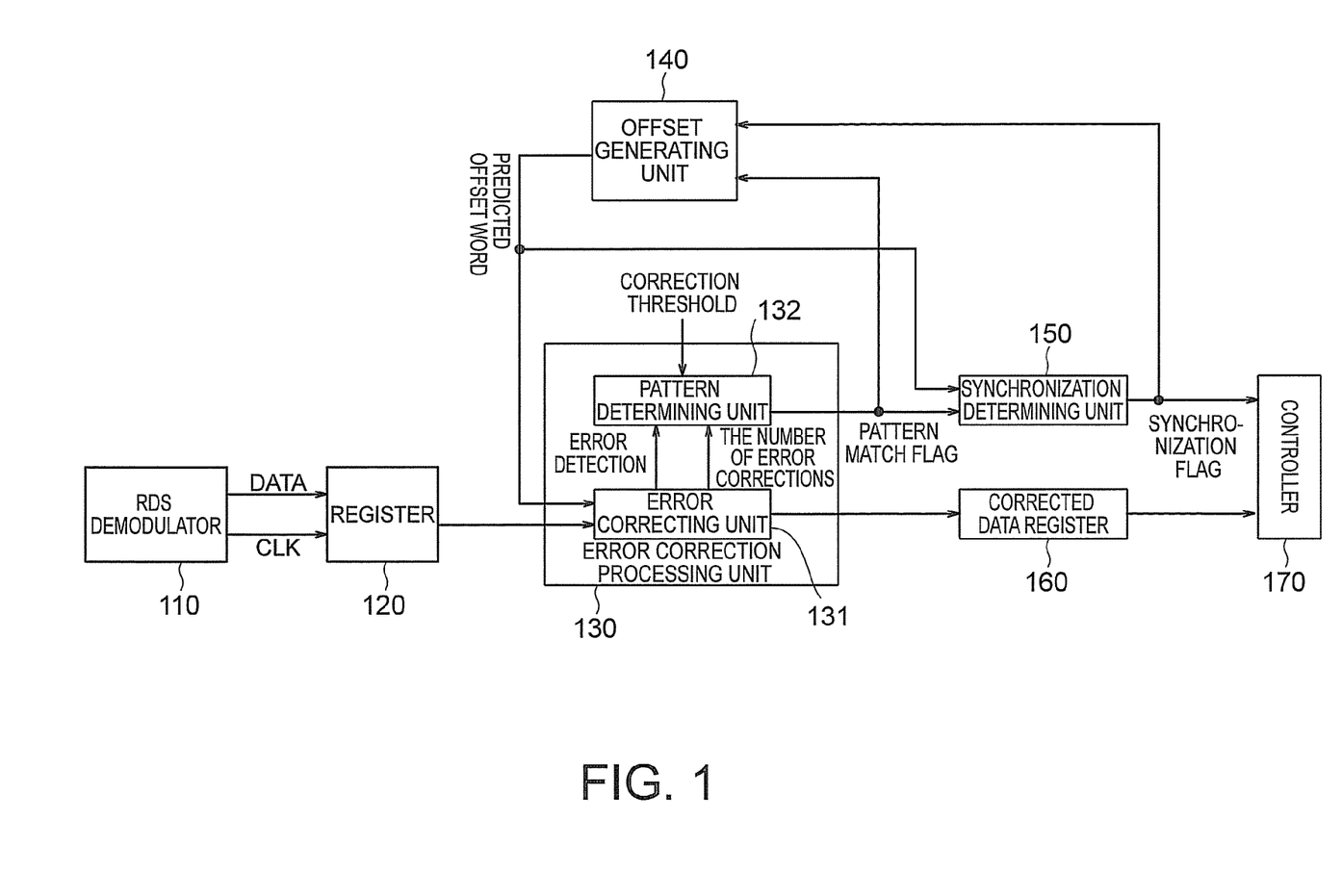
FIG. 1 is a schematic block diagram of an RDS compatible receiver according to a first embodiment of the present invention.

FIG. 1 shows a schematic configuration of an RDS compatible receiver according to a first embodiment of the present invention. The RDS compatible receiver includes an RDS demodulator 110, a register 120, an error correction processing unit 130, an offset generating unit 140, a synchronization determining unit 150, a corrected data register 160, and a controller 170. The error correction processing unit 130 has an error correcting unit 131 and a pattern determining unit 132.

The RDS demodulator 110 demodulates RDS data included in a received broadcast wave. The demodulated RDS data is inputted to the register 120 in clock synchronization.

RDS data is repeatedly broadcasted on a group basis in which each group is 104-bit data. Each group consists of four blocks, and each block is composed of a 16-bit information word and a 10-bit appended word. Accordingly, the register 120 is a SIPO (Serial Input Parallel Output) register having 26 bits (=16 bits+10 bits).

An appended word is generated by an exclusive OR operation between a check word derived by syndrome calculation of error correcting code from an information word and an offset word for block identification. The offset generating unit 140 predicts one of offset words "A", "B", "C" (or "C'"), and "D" and outputs it.

The predicted offset word outputted from the offset generating unit 140 and an output (26-bit RDS data) of the register 120 are inputted to the error correcting unit 131. A check word is obtained from an appended word in lower 10 bits of RDS data and the predicted offset word, and error detection is performed using the check word to determine whether correction is possible (correcting capability is enough) or not. If error correction is determined to be possible, error correction is performed.

The data whose error is corrected is outputted to corrected data register 160. In addition, an error detection result and the number of error corrections (the number of bits of corrected errors) are outputted to the pattern determining unit 132.

The pattern determining unit 132 detects whether or not there is an occurrence of a pseudo error based on the error detection result and the number of error corrections. For example, if a detection result that there is no error and the number of error corrections greater than or equal to one are inputted, there may be a pseudo error at the error correcting unit 131. By comparison between an error detection result and the number of error corrections, an occurrence of a pseudo error is detected.

In addition, a correction threshold is set in the pattern determining unit 132. The correction threshold can be set to any value by a user, and preferably is 1 or 2. If the number of error corrections is less than or equal to the correction threshold, the pattern determining unit 132 determines that error correction of RDS data has been properly performed using the predicted offset word outputted from the offset generating unit 140, that is, the predicted offset word has been right. Then, the pattern determining unit 132 outputs a pattern match flag whose value is 1. If the number of error corrections is greater than the correction threshold, the pattern determining unit 132 determines that the predicted offset word has been false, and then outputs a pattern match flag whose value is 0.

The synchronization determining unit 150 receives a pattern match flag and a predicted offset word as input. The synchronization determining unit 150 determines whether or not a predicted offset word determined to be right with respect to a 26-bit RDS data block that is inputted at this time is continuous with a predicted offset word determined to be right with respect to a 26-bit RDS data block that is inputted at the previous time.

Offset words added to four blocks in an RDS data group are "A", "B", "C" (or "C'"), "D" in order. Thus, the synchronization determining unit 150 checks whether the predicted offset words determined to be right are in this order or not. If they are in this order, the synchronization determining unit 150 determines that synchronization is established and outputs a synchronization flag. For example, when synchronization is established, the synchronization flag is set to 1. The synchronization flag is given to the offset generating unit 140 and the controller 170.

The offset generating unit 140 outputs a predicted offset word based on the pattern match flag and the synchronization flag. The offset generating unit 140 determines that a right offset word is inputted if synchronization is established. Since then it outputs offset words in the order of "A", "B", "C" (or "C'"), "D", "A", and so on.

If, at start of processing or the like, which offset word is right cannot be recognized and therefore an offset word cannot be predicted, the offset generating unit 140 outputs all offset words "A", "B", "C" (or "C'"), and "D" in this order with respect to one data block. Then, a pattern-matched offset word or an offset word having the number of error corrections minimized is assumed to be a right offset word, and a next offset word to be outputted is predicted.

The controller 170 outputs corrected data outputted from corrected data register 160 to a memory such as a RAM and a display control circuit (both are not shown), based on the synchronization flag. Thereby, synchronization is established, and error is corrected using the right offset word.

Figure 2:
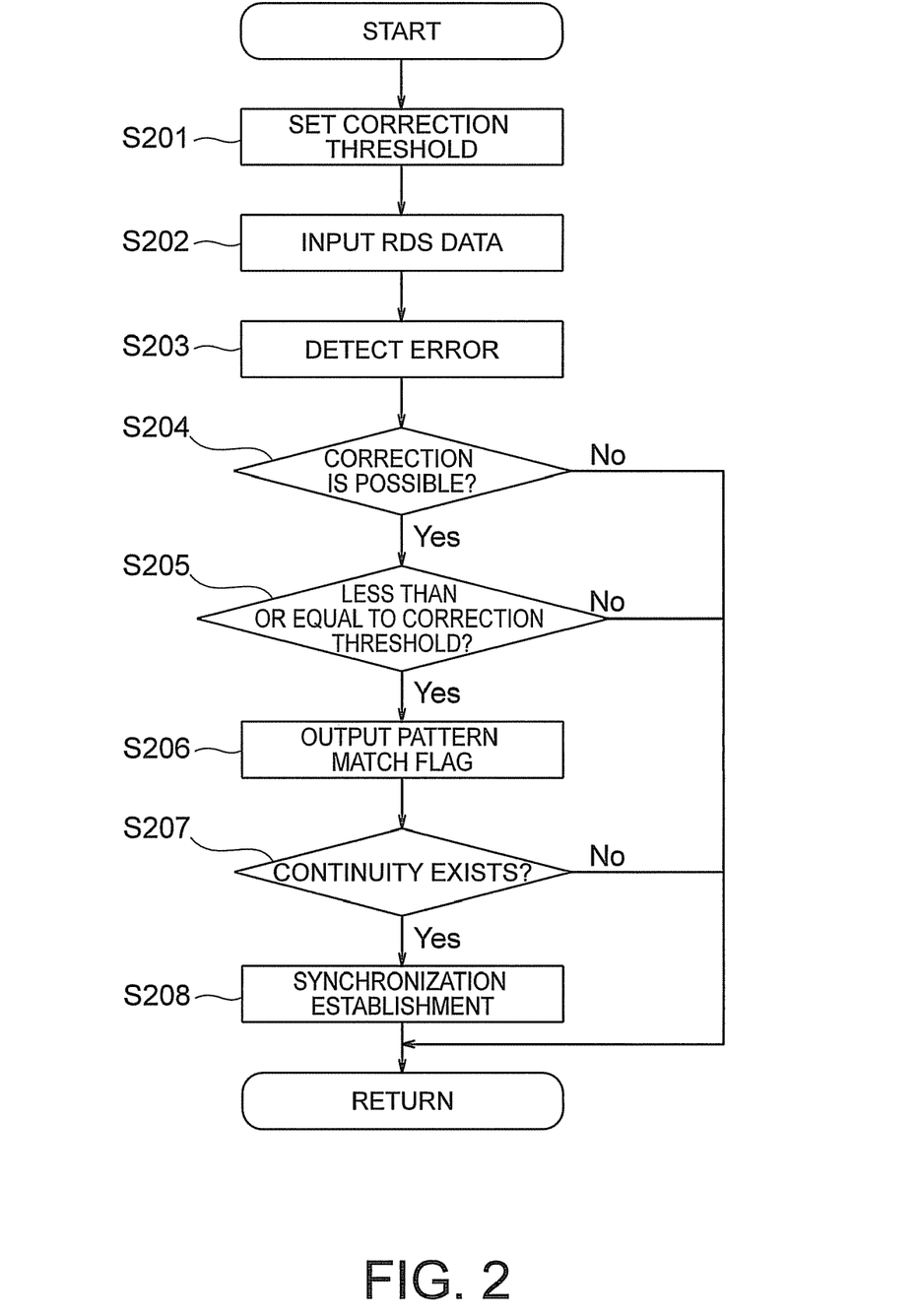
FIG. 2 is a flowchart of a synchronization detecting method according to the first embodiment of the present invention.

A synchronization detecting method by an RDS compatible receiver as described above will be described with reference to the flowchart shown in FIG. 2.

(Step S201) A correction threshold is set in the pattern determining unit 132.

(Step S202) 26-bit block data of RDS data is outputted from the register 120 and given to the error correcting unit 131.

(Step S203) The error correcting unit 131 performs error detection using RDS data and a predicted offset word.

(Step S204) Whether error correction is possible or not is determined. If error correction is possible, the process proceeds to step S205.

(Step S205) The error correcting unit 131 performs error correction. The number of error corrections is counted while the error correction is performed, and the number of error corrections is outputted to the pattern determining unit 132. The pattern determining unit 132 determines whether or not the number of error corrections is less than or equal to the correction threshold. If it is less than or equal to the correction threshold, the process proceeds to step S206.

(Step S206) The predicted offset word is determined to be right, and a pattern match flag is outputted from the pattern determining unit 132.

(Step S207) Processing of Steps S203 to S206 is applied to continuous two block data. If a predicted offset word is determined to be right in step S206 with respect to both of the two block data, the synchronization determining unit 150 determines whether the predicted offset words respectively corresponding to the two block data are continuous or not.

In other words, the synchronization determining unit 150 determines whether or not an order of the predicted offset words respectively corresponding to the continuous two block data matches a predetermined offset sequence pattern in the order of ("A", "B", "C" (or "C'"), "D", "A", . . . ).

If the synchronization determining unit 150 determines that the predicted offset words respectively corresponding to the continuous two block data are continuous, the process proceeds to step S208.

(Step S208) Synchronization of the RDS data is determined to be established, and a synchronization flag is outputted. Since then, offset words are outputted in the order of "A", "B", "C" (or "C'"), "D", "A", and so on.

If error correction is determined to be impossible in step S204, if the number of error corrections is greater than the correction threshold in step S205, or if the predicted offset words are determined to be not continuous in step S207, the process is returned to step S202 and restarted therefrom.

In this way, when error correction is possible using a predicted offset word, synchronization detection is performed by determining whether or not the number of error corrections is less than or equal to a correction threshold. Thereby, synchronization can be performed even with respect to data containing an error, so that synchronization can be early established.

In addition, since an offset word is predicted and used, syndrome calculation involved with offset detection can be omitted, so that a processing load can be reduced.

Second Embodiment

Figure 3:
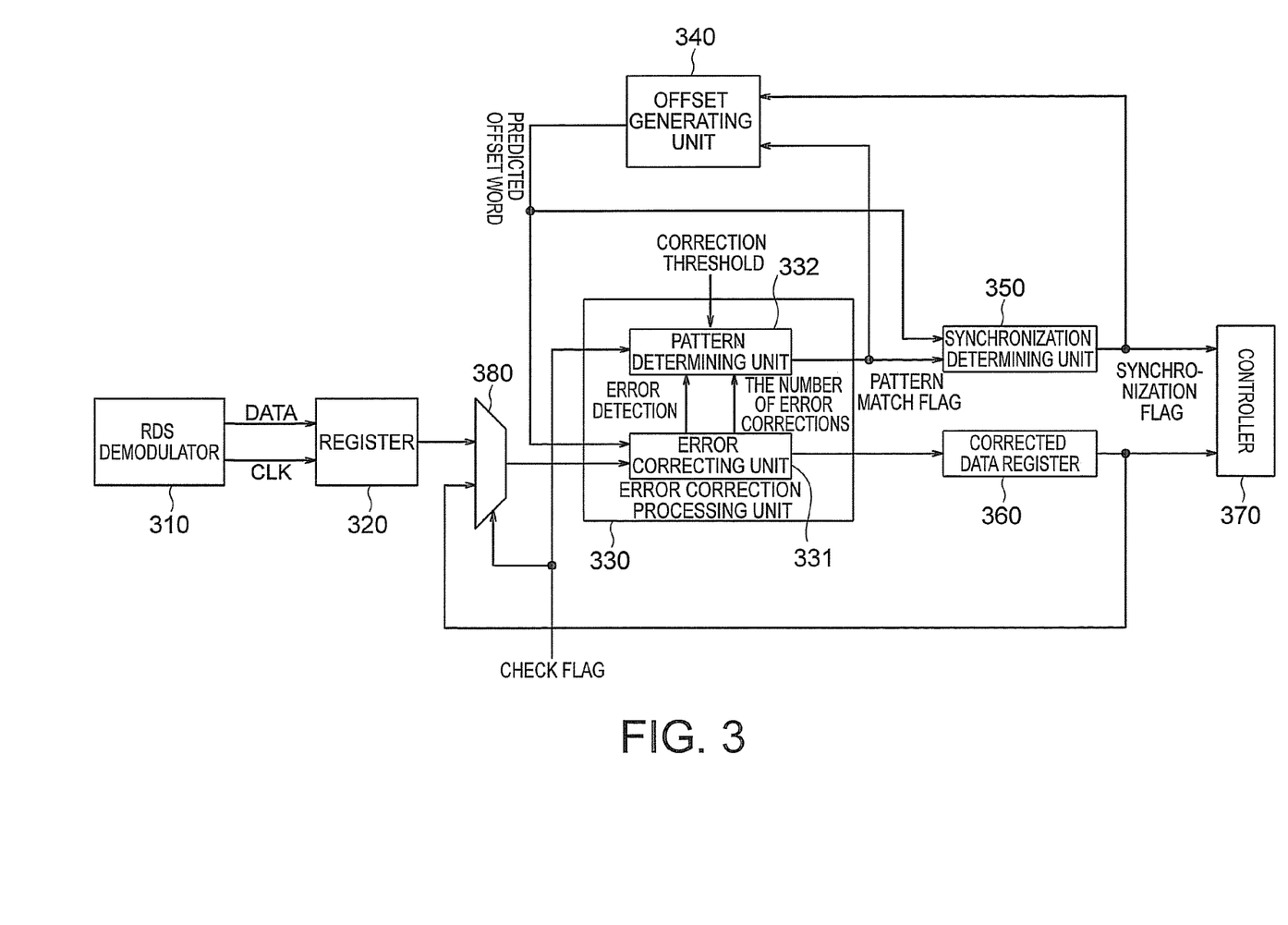
FIG. 3 is a schematic block diagram of an RDS compatible receiver according to a second embodiment of the present invention.

FIG. 3 shows a schematic configuration of an RDS compatible receiver according to a second embodiment of the present invention. The RDS compatible receiver includes an RDS demodulator 310, a register 320, an error correction processing unit 330, an offset generating unit 340, a synchronization determining unit 350, a corrected data register 360, a controller 370, and a multiplexer 380. The error correction processing unit 330 has an error correcting unit 331 and a pattern determining unit 332.

The RDS compatible receiver according to the present embodiment is the RDS compatible receiver according to the first present embodiment shown in FIG. 1 further including the multiplexer 380.

The multiplexer 380 is given an output of the register 320 and an output of the corrected data register 360, and outputs one of them according to a value of a check flag. The check flag is also given to the pattern determining unit 332, and outputted from the controller 370 or another circuit.

For example, if a check flag value is 0, the multiplexer 380 selects and outputs an output of the register 320, and if a check flag value is 1, the multiplexer 380 selects and outputs an output of the corrected data register 360.

By switching a check flag value between 1 and 0 alternately, whether or not an error is detected again in data whose error has been corrected can be determined.

If, after a predicted offset word is once determined to be right (a pattern match flag value is 1), an error is detected in data whose error has been corrected, the pattern determining unit 332 determines that pattern matching is invalid and sets a pattern match flag to 0 based on a error detection result and a check flag value.

Figure 4:
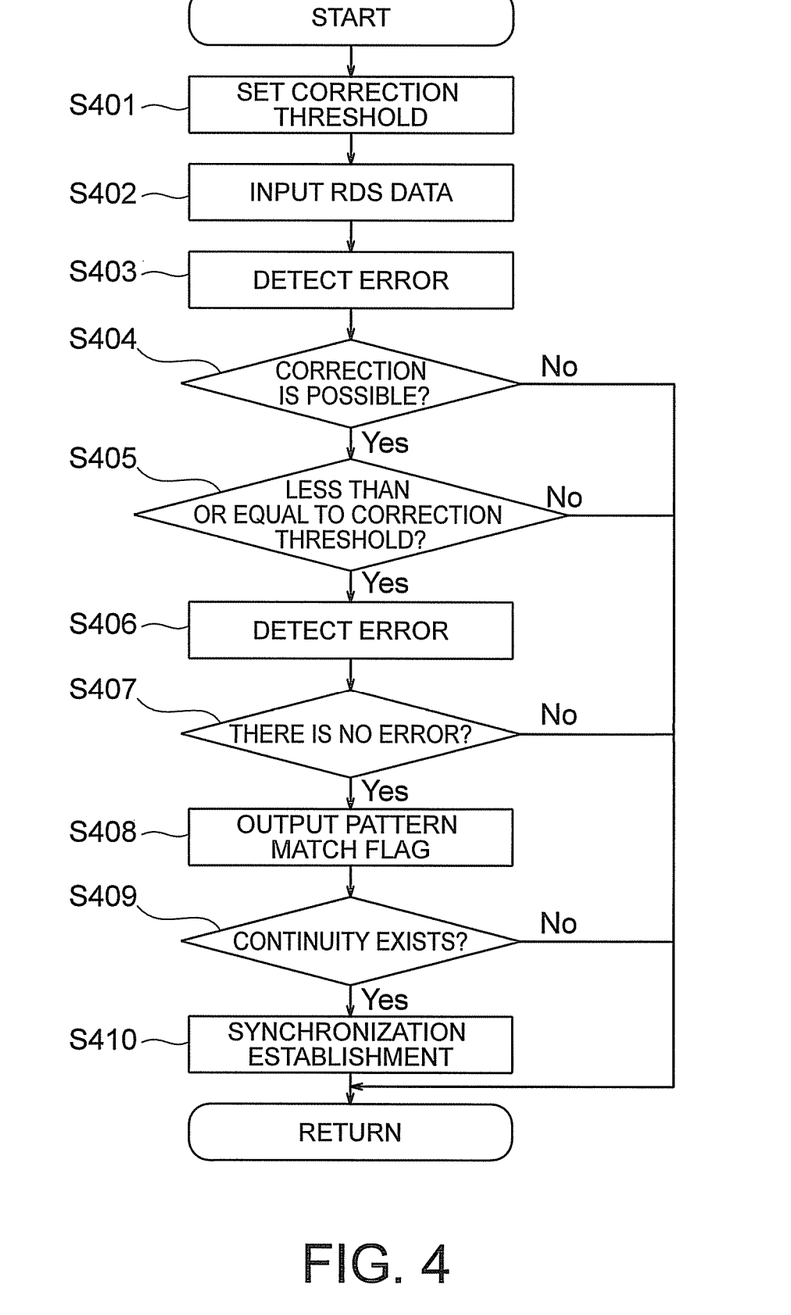
FIG. 4 is a flowchart of a synchronization detecting method according to the second embodiment of the present invention.

A synchronization detecting method by this RDS compatible receiver will be described with reference to the flowchart shown in FIG. 4.

(Step S401) A correction threshold is set in the pattern determining unit 332.

(Step S402) The multiplexer 380 selects RDS data outputted from the register 320 and outputs it to the error correcting unit 331.

(Step S403) The error correcting unit 331 performs error detection using the RDS data and a predicted offset word.

(Step S404) Whether error correction is possible or not is determined. If error correction is possible, the process proceeds to step S405.

(Step S405) The error correcting unit 331 performs error correction. The number of error corrections is counted while the error correction is performed, and the number of error corrections is outputted to the pattern determining unit 332. The pattern determining unit 332 determines whether or not the number of error corrections is less than or equal to the correction threshold. If it is less than or equal to the correction threshold, the process proceeds to step S406.

(Step S406) A check flag is switched, and the multiplexer 380 selects error-corrected data outputted from the corrected data register 360 and outputs the selected error-corrected data. Then, the error correcting unit 331 performs error detection using the error-corrected data and the predicted offset word. The predicted offset word is the same as that in step S403.

(Step S407) If no error is detected, the process proceeds to step S408.

(Step S408) The predicted offset word is determined to be right, and a pattern match flag is outputted from the pattern determining unit 332.

(Step S409) The synchronization determining unit 350 determines whether or not the predicted offset word is continuous with a predicted offset word of the previous block data. If they are continuous, the process proceeds to step S410.

(Step S410) Synchronization establishment of the RDS data is detected, and a synchronization flag is outputted from the synchronization determining unit 350. Since then, offset words are outputted in the order of "A", "B", "C" (or "C'"), "D", "A", and so on.

If error correction is determined to be impossible in step S404, if the number of error corrections is greater than the correction threshold in step S405, if an error is detected in step S407, or if the predicted offset words are determined to be not continuous in step S409, the process is returned to step S402 and restarted therefrom.

In this way, when error correction is possible, and the number of error corrections is less than or equal to a correction threshold, block pattern detection is performed. Thereby, synchronization can be performed even with respect to data containing an error, so that synchronization can be early established.

In addition, since an offset word is predicted and used, syndrome calculation involved with offset detection can be omitted, so that a processing load can be reduced.

In step S404, if RDS data contains error (for example, error having 6 or more bits) which exceeds capacity of an error correcting ability of the error correction processing unit 330, error correction may be determined to be possible by mistake so that pseudo pattern matching may occur.

In step S406, if error detection processing is performed again for recalculation using error-corrected data, an occurrence of pseudo pattern matching can be prevented.

In the above described embodiment, a correction threshold after synchronization establishment may be changed from that before the synchronization establishment. Before synchronization establishment, prediction of an offset word is difficult, and pseudo pattern matching can easily occur. Therefore, when a correction threshold is large, pseudo pattern matching can easily occur, and it is difficult to perform accurate synchronization establishment.

On the other hand, after synchronization establishment, an offset word can be easily predicted from an algorithm of RDS (in the order of "A", "B", "C" (or "C'"), "D", "A", . . . ).

Therefore, even when a correction threshold is large, pattern detection can be performed relatively accurately.

Figure 5:
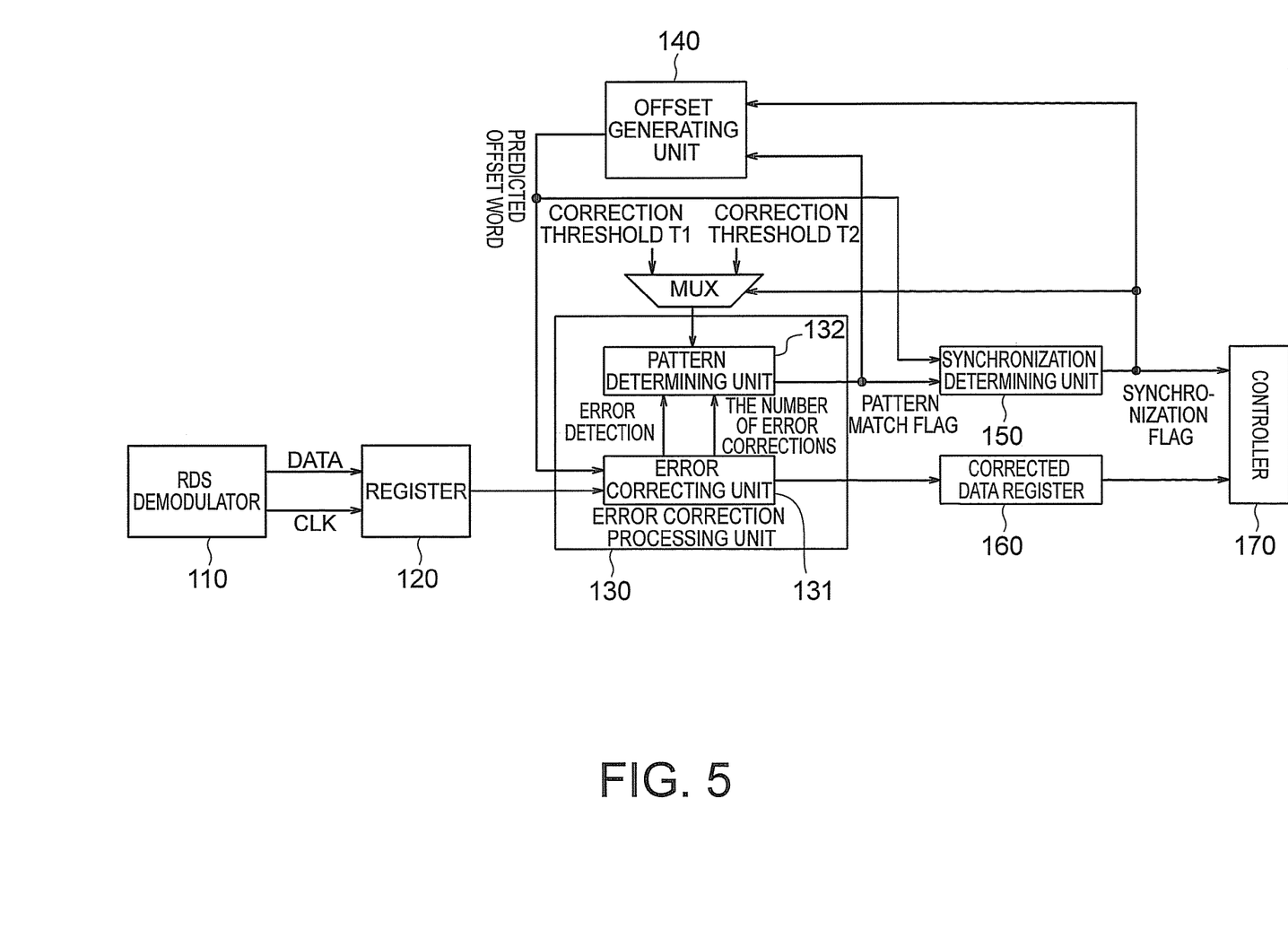
FIG. 5 is a schematic block diagram of an RDS compatible receiver according to a modification.
Figure 6:
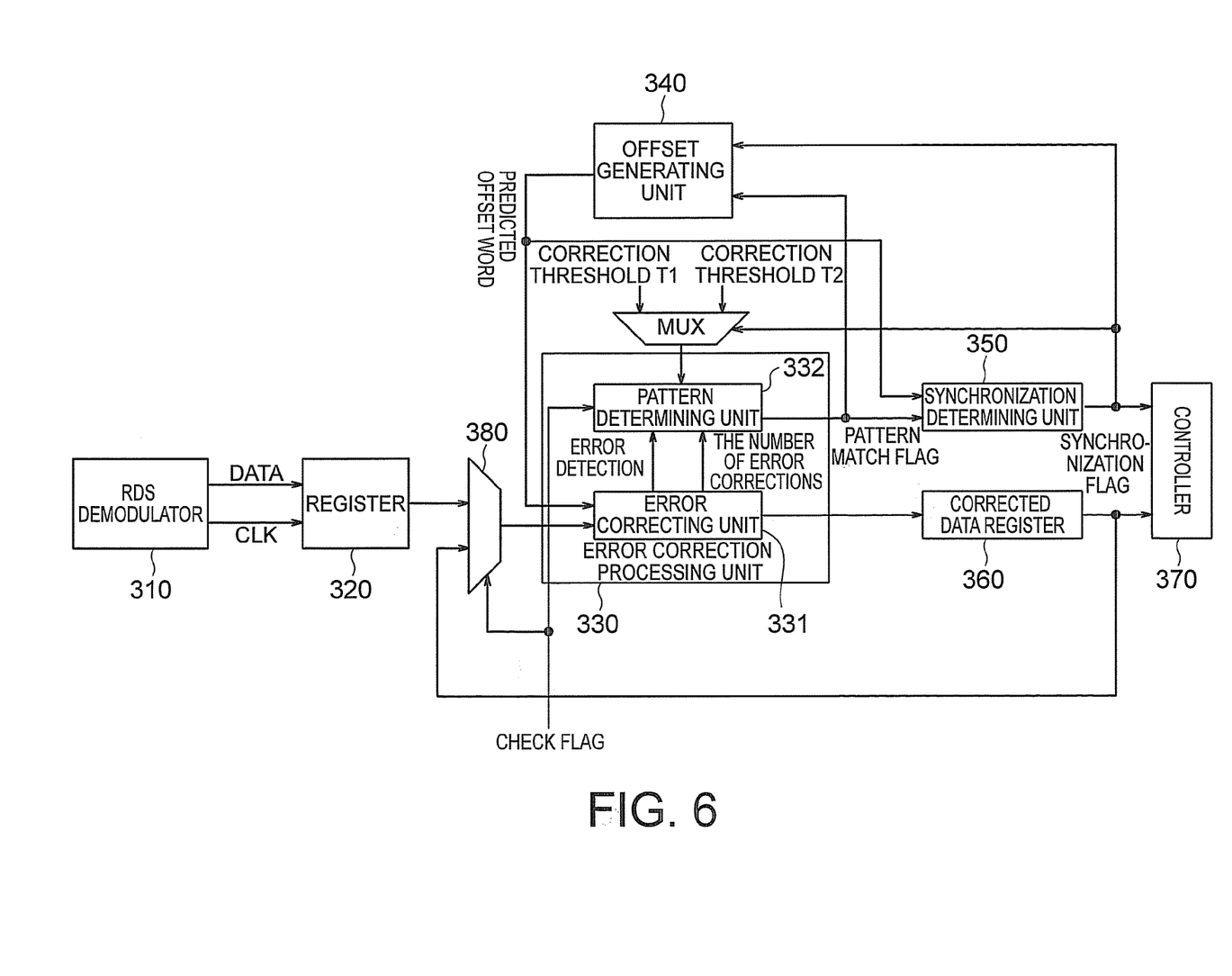
FIG. 6 is a schematic block diagram of an RDS compatible receiver according to a modification.

Switching of correction thresholds can be achieved by, for example, a configuration in which two types of correction thresholds ("T1", "T2") are inputted to a multiplexer MUX, and one of the correction thresholds is selected based on a synchronization flag value and outputted to the pattern determining unit. Schematic configurations of RDS compatible receivers of the first and second embodiments to which a configuration as described above will be shown in FIG. 5, FIG. 6, respectively.

Figure 7:
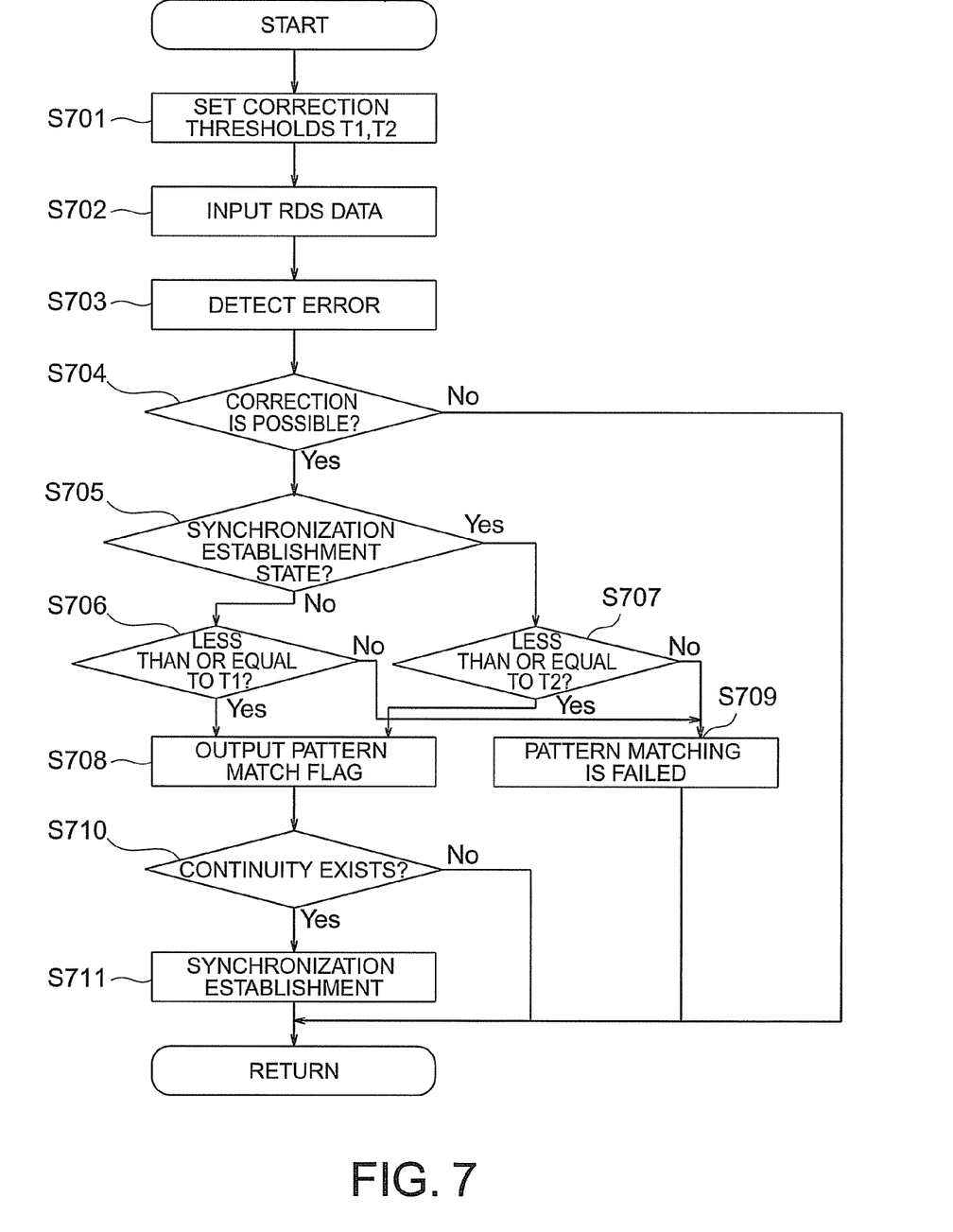
FIG. 7 is a flowchart of a synchronization detecting method according to a modification.

A synchronization detecting method in a case where such switching of correction thresholds is applied to the first embodiment will be described with reference to the flowchart shown in FIG. 7.

(Step S701) A correction threshold before synchronization establishment "T1" and a correction threshold after synchronization establishment "T2" ("T1"<"T2") are inputted to the multiplexer MUX.

(Step S702) RDS data is given to the error correcting unit 131.

(Step S703) The error correcting unit 131 performs error detection using the RDS data and a predicted offset word.

(Step S704) Whether error correction is possible or not is determined. If error correction is possible, the process proceeds to step S705.

(Step S705) Whether or not synchronization has been established with respect to previous data block based on a synchronization flag value. If synchronization has not been established, the process proceeds to step S706. If synchronization has been established, the process proceeds to step S707.

(Step S706) The error correcting unit 131 performs error correction. The number of error corrections is counted while the error correction is performed, and the number of error corrections is outputted to the pattern determining unit 132. If the number of error corrections is less than or equal to the correction threshold "T1", the process proceeds to step S708. If it is greater than the correction threshold "T1", the process proceeds to step S709.

(Step S707) The error correcting unit 131 performs error correction. The number of error corrections is counted while the error correction is performed, and the number of error corrections is outputted to the pattern determining unit 132. If the number of error corrections is less than or equal to the correction threshold "T2", the process proceeds to step S708. If it is greater than the correction threshold "T2", the process proceeds to step S709.

(Step S708) The predicted offset word is determined to be right, and a pattern match flag is outputted from the pattern determining unit 132.

(Step S709) Pattern matching is determined to be failed (the predicted offset word is determined to be false).

(Step S710) The synchronization determining unit 150 determines whether or not the offset word is continuous with an offset word of the previous block data. If they are continuous, the process proceeds to step S711.

(Step S711) Synchronization establishment of the RDS data is detected. Since then, offset words are outputted in the order of "A", "B", "C" (or "C'"), "D", "A", and so on.

In a case where a correction threshold after synchronization establishment is changed from that before the synchronization establishment as described above, an RDS compatible receiver can be provided which can establish early synchronization while preventing false synchronization establishment, in which synchronization is hard to be released and highly stable after synchronization establishment.

In addition, in the above described embodiment, before synchronization establishment, error correction processing is applied to all offset words assuming they are candidates. If it is determined that error corrections is possible in a plurality of offset words, a predicted offset word having the number of error corrections minimized may be determined to be a right offset word. It is because the fewer the number of error corrections, the higher reliability such that more accurate synchronization detection processing can be performed.

Although offset words to be outputted from the offset generating unit are four types of offset words: "A", "B", "C" (or "C'"), and "D" as described above, they may be five types of offset words: "A", "B", "C" (or "C'"), "D", and "E". Although synchronization is determined to be established when predicted offset words are pattern-matched in continuous two blocks in the above described embodiments, synchronization may be determined to be established, for example, when predicted offset words are pattern-matched in two blocks among continuous three blocks.

What is claimed is:

1. An RDS compatible receiver comprising:
    a demodulator which demodulates RDS data included in a received broadcast wave and outputs demodulated RDS data;
    a register which converts the demodulated RDS data to block data and outputs the block data;
    an offset generating unit which is given a pattern match flag signal and a synchronization flag signal, predicts an offset word of the block data based on values of the pattern match flag signal and the synchronization flag signal, and outputs the predicted offset word;
    an error correction processing unit which is given the predicted offset word and the block data, performs error detection and error correction of the block data using the predicted offset word, counts the number of error corrections, compares the number of error corrections with a predetermined correction threshold, determines whether the predicted offset word is right or not based on the comparison result, and outputs the pattern match flag signal based on the determination result;
    a synchronization determining unit which is given the predicted offset word and the pattern match flag signal sequentially, detects whether or not the predicted offset word determined to be right matches a predetermined offset sequence pattern, determines whether RDS block synchronization is established or not based on the detection result, and outputs the synchronization flag signal based on the determination result; and
    a multiplexer which is given a first correction threshold, a second correction threshold that is greater than the first correction threshold, and the synchronization flag signal, selects one of the first correction threshold and the second correction threshold based on a value of the synchronization flag signal, and outputs the selected threshold to the error correction processing unit as the predetermined correction threshold.

2. The RDS compatible receiver according to claim 1, wherein the error correction processing unit comprises:
    an error correcting unit which is given the predicted offset word and the block data, performs error detection and error correction of the block data using the predicted offset word, and counts and outputs the number of error corrections; and
    a pattern determining unit which compares the number of error corrections and the correction threshold, determines the predicted offset word is right if the number of error corrections is less than or equal to the correction threshold, determines the predicted offset word is false if the number of error corrections is greater than the correction threshold, and outputs the pattern match flag signal based on a determination result.

3. The RDS compatible receiver according to claim 1, further comprising a multiplexer which is given a first correction threshold, a second correction threshold that is greater than the first correction threshold, and the synchronization flag signal, selects one of the first correction threshold and the second correction threshold based on a value of the synchronization flag signal, and outputs the selected threshold to the error correction processing unit as the predetermined correction threshold.

4. The RDS compatible receiver according to claim 1, wherein the multiplexer selects the second correction threshold, based on the synchronization flag signal which the synchronization determining unit outputs when determining that the RDS block synchronization is established, and selects the first correction threshold, based on the synchronization flag signal which the synchronization determining unit outputs when determining that the RDS block synchronization is not established.

5. The RDS compatible receiver according to claim 1,
    wherein the offset generating unit outputs a plurality types of the predicted offset words, and
    wherein the error correction processing unit performs error correction of the block data using each of the plurality types of the predicted offset words, counts the number of error corrections, and if there is a plurality of the predicted offset words which have the number of error corrections less than or equal to the correction threshold, determines the predicted offset word which has the number of error corrections minimized to be right.

6. An RDS compatible receiver comprising:
    a demodulator which demodulates RDS data included in a received broadcast wave and outputs demodulated RDS data;
    a register which converts the demodulated RDS data to block data and outputs the block data;
    an offset generating unit which is given a pattern match flag signal and a synchronization flag signal, predicts an offset word of the block data based on values of the pattern match flag signal and the synchronization flag signal, and outputs the predicted offset word;
    a first multiplexer which is given a check flag signal, error correction block data, the block data, selects and outputs the block data if the check flag signal is a first value, and selects and outputs the error correction block data if the check flag signal is a second value which is different from the first value;
    an error correction processing unit which is given the predicted offset word, output data of the first multiplexer, and the check flag signal, and if the check flag signal is the first value, performs error detection and error correction of the block data using the predicted offset word, counts the number of error corrections, compares the number of error corrections with a predetermined correction threshold, determines whether the predicted offset word is right or not based on the comparison result, and outputs the pattern match flag signal based on the determination result, and if the check flag signal is the second value, performs error detection of the error correction block data using the predicted offset word, determines whether the predicted offset word is right or not based on the detection result, and outputs the pattern match flag signal based on the determination result;

a corrected data register which stores the block data whose error is corrected by the error correction processing unit and outputs the block data as the error correction block data; and a synchronization determining unit which is given the predicted offset word and the pattern match flag signal sequentially, detects whether or not the predicted offset word determined to be right matches a predetermined offset sequence pattern, determines whether RDS block synchronization is established or not based on the detection result, and outputs the synchronization flag signal based on the determination result.

7. The RDS compatible receiver according to claim 6, further comprising a second multiplexer which is given a first correction threshold, a second correction threshold that is greater than the first correction threshold, and the synchronization flag signal, selects one of the first correction threshold and the second correction threshold based on a value of the synchronization flag signal, and outputs the selected threshold to the error correction processing unit as the predetermined correction threshold.

8. The RDS compatible receiver according to claim 7, wherein the second multiplexer selects the second correction threshold, based on the synchronization flag signal which the synchronization determining unit outputs when determining that the RDS block synchronization is established, and selects the first correction threshold, based on the synchronization flag signal which the synchronization determining unit outputs when determining that the RDS block synchronization is not established.

9. The RDS compatible receiver according to claim 6,
wherein the offset generating unit outputs a plurality types of the predicted offset words, and
wherein the error correction processing unit performs error correction of the block data using each of the plurality types of the predicted offset words, counts the number of error corrections, and if there is a plurality of the predicted offset words which have the number of error corrections less than or equal to the correction threshold, determines the predicted offset word which has the number of error corrections minimized to be right.

10. An RDS data receiving method comprising:
demodulating RDS data included in a received broadcast wave to generate demodulated RDS data;
converting the demodulated RDS data to block data, and generating first block data and second block data in sequence;
predicting an offset word corresponding to the first block data to generate a first predicted offset word,
performing error detection and error correction of the first block data using the first predicted offset word, and counting the number of error corrections to calculate a first number of error corrections;
comparing the first number of error corrections with a predetermined correction threshold, and determining the first predicted offset word is right if the first number of error corrections is less than or equal to the correction threshold;
predicting an offset word corresponding to the second block data to generate a second predicted offset word;
performing error detection and error correction of the second block data using the second predicted offset word, and counting the number of error corrections to calculate a second number of error corrections;
comparing the second number of error corrections with the correction threshold, and determining the second predicted offset word is right if the second number of error corrections is less than or equal to the correction threshold; and
if both of the first predicted offset word and the second predicted offset word are determined to be right, detecting whether or not an order of the first predicted offset word and the second predicted offset word matches a predetermined offset sequence pattern, and if it matches, determining RDS block synchronization to be established and outputting the second block data whose error is corrected.

* * * * *